United States Patent [19]
Hong et al.

[11] Patent Number: 6,046,113
[45] Date of Patent: Apr. 4, 2000

[54] COMBINED DRY AND WET ETCH FOR IMPROVED SILICIDE FORMATION

[75] Inventors: Qi-Zhong Hong, Dallas, Tex.; Shouli Hsia, San Jose, Calif.

[73] Assignee: Texas Instruments Incorporated, Dallas, Tex.

[21] Appl. No.: 08/957,171

[22] Filed: Oct. 24, 1997

Related U.S. Application Data

[60] Provisional application No. 60/028,792, Oct. 31, 1996.

[51] Int. Cl.[7] .................................................. H01L 21/302
[52] U.S. Cl. ......................... 438/694; 438/704; 438/712; 438/733; 438/734; 438/745
[58] Field of Search .................................... 438/694, 704, 438/712, 733, 734, 745

[56] References Cited

U.S. PATENT DOCUMENTS

| | | | |
|---|---|---|---|
| 5,464,782 | 11/1995 | Koh | 437/41 |
| 5,652,172 | 7/1997 | Peng Yung-Sung et al. | 437/60 |
| 5,912,185 | 6/1999 | Kwon | 438/698 |

*Primary Examiner*—Benjamin L. Utech
*Assistant Examiner*—Matthew Anderson
*Attorney, Agent, or Firm*—Jacqueline J. Garner; Wade James Brady, III; Frederick J. Telecky, Jr.

[57] ABSTRACT

A method of removing an outer layer from an inner surface during semiconductor fabrication. A portion of the outer layer (50) may be anisotropically etched. A remaining portion of the outer layer (55) may then be wet etched without impairing the inner surface (12).

26 Claims, 2 Drawing Sheets

COMBINED DRY AND WET ETCH FOR IMPROVED SILICIDE FORMATION

RELATED APPLICATION

This application is related to copending U.S. patent application Ser. No. 08/957,808, entitled "SURFACE PROTECTIVE LAYER FOR IMPROVED SILICIDE FORMATION".

This application claims priority under 35 USC § 119 (e)(1) of provisional application Ser. No. 60/028,792, filed Oct. 31, 1996.

TECHNICAL FIELD OF THE INVENTION

This invention relates generally to the field of electronic devices and more particularly to a combined dry and wet etch for improved silicide formation.

BACKGROUND OF THE INVENTION

Electronic equipment such as televisions, telephones, radios and computers are often constructed of solid state devices. Solid state devices operate based on the movement of charge carriers. Accordingly, solid state devices have no moving parts.

Solid state devices are generally preferred in electronic equipment because they are extremely reliable, very small and relatively inexpensive. Solid state devices may be transistors, capacitors, resistors and the like. Such devices are often formed as part of an integrated circuit.

Solid state devices are typically formed by depositing, growing, patterning and etching a series of layers. Different layers may comprise conducting, semiconducting or insulating material. Often, such layers are anisotropically etched to form the various elements of a solid state device. Anisotropic etches may also be used to remove layers without damaging previously formed elements. An anisotropic etch may be a reactive ion etch (RIE) or the like. A problem with anisotropic etches, however, is that they often leave a residual layer of contaminants. These contaminants may interfere with later semiconductor processing such as silicide formation.

SUMMARY OF THE INVENTION

Accordingly, a need has arisen in the art for an improved method of etching layers during fabrication of a semiconductor device. The present invention provides a combined dry and wet etch that substantially eliminates or reduces the disadvantages and problems associated with prior etching techniques.

In accordance with the present invention, a method of removing an outer layer from an inner surface during semiconductor fabrication may comprise the step of anisotropically etching a portion of the outer layer. A remaining portion of the outer layer may then be wet etched without impairing the inner surface.

Important technical advantages of the present invention include providing a clean anisotropic etch. In particular, a significant portion of an outer layer may be anisotropically etched. The anisotropic etch will not damage an inner surface of another layer. The remaining portion of the outer layer may be wet etched to prevent contaminants from accumulating on the inner surface that would interfere with later semiconductor processing. Because the duration of the wet etch is relatively short, the wet etch will not impair the inner surface, nor will it cause significant oxide undercut.

Other technical advantages will be readily apparent to one skilled in the art from the following figures, descriptions, and claims.

BRIEF DESCRIPTION OF THE DRAWINGS

For a more complete understanding of the present invention and its advantages thereof, reference is now made to the following description taken in conjunction with the accompanying drawings, wherein like reference numerals represent like parts, in which.

DETAILED DESCRIPTION OF THE INVENTION

The preferred embodiments of the present invention and its advantages are best understood by referring now in more detail to FIGS. 1A–I of the drawings, in which like numerals refer to like parts throughout the several views. FIGS. 1A–I illustrate a method of fabricating a transistor using a combined dry and wet etch to improved silicide formation. As described in more detail below, the combined dry and wet etch provides a clean and mostly anisotropic etch that removes an outer layer without leaving a residual layer of contaminants on an inner surface that would interfere with later semiconductor processing and without impairing the inner surface. It will be understood that the combined dry and wet etch of the invention may be used for fabrication of other types of solid state devices and for improving other types of later semiconductor processing.

Figure 1A:
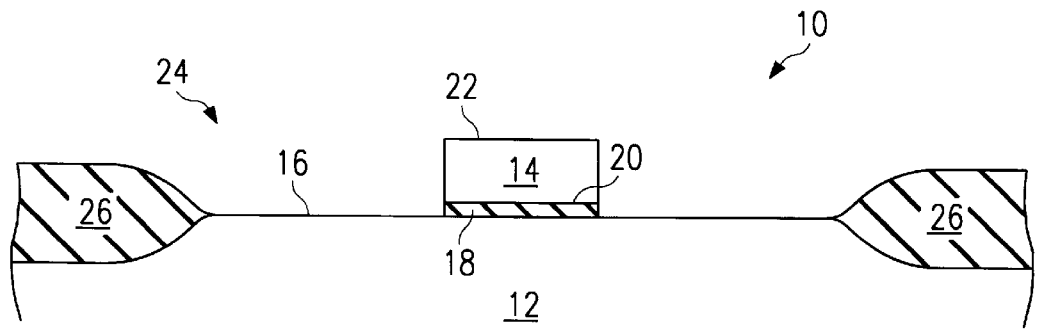
FIGS. 1A, 1B, 1C, 1D, 1E, 1F, 1G, 1H are a series of schematic cross-sectional diagrams illustrating a transistor fabrication process using a combined dry and wet etch in accordance with one embodiment of the present invention.

FIG. 1A shows an initial semiconductor structure 10 for fabricating a transistor. Preferably, the transistor is a narrow linewidth transistor. The initial semiconductor structure 10 may have a semiconductor layer 12 and a gate body 14. The semiconductor layer 12 may be substrate such as a wafer. It will be understood that the semiconductor layer 12 may also be a layer of semiconductor material formed on a substrate. For example, the semiconductor layer 12 may be an epitaxial layer grown on a wafer.

In one embodiment, the semiconductor layer 12 may be a (p)-type silicon substrate. In this embodiment, the semiconductor layer 12 may comprise a single-crystalline silicon material that has been slightly doped with a (p)-type dopant such as boron. It will be understood that the present invention may be used with an (n)-type semiconductor substrate or layer.

The gate body 14 may be separated from an outer surface 16 of the semiconductor layer 12 by a gate insulator 18. The gate body 14 may have an inner surface 20 adjacent to the gate insulator 18 and an opposite outer surface 22. The gate body 14 may comprise polycrystalline silicon or other suitable semiconductor material. The gate insulator 18 may comprise silicon dioxide or other suitable insulator material.

The gate body 14 and the gate insulator 18 may be formed in a window 24 between field oxide 26. The window 24 may be formed using conventional photolithography techniques associated with pattern and etching. The field oxide 26 may be formed as a result of a local oxidation process. In one embodiment, the gate body 14 may have a linewidth of less than five (5) micrometers ($\mu$m). This small size allows the transistor to be used in miniaturized circuits that demand extremely small solid state devices.

Figure 1B:
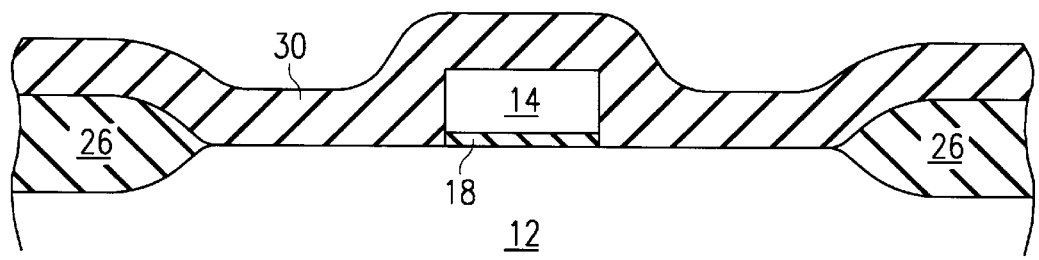

Referring to FIG. 1B, an insulator layer 30 may be deposited outwardly of the semiconductor layer 12 and the gate body 14. As shown by FIG. 1B, the insulator layer 30 may be deposited directly onto the semiconductor layer 12 and the gate body 14. The insulator layer 30 may be an oxide layer conventionally made of silicon dioxide. It will be understood that the insulator layer 30 may comprise other materials capable of insulating semiconductor elements.

Figure 1C:
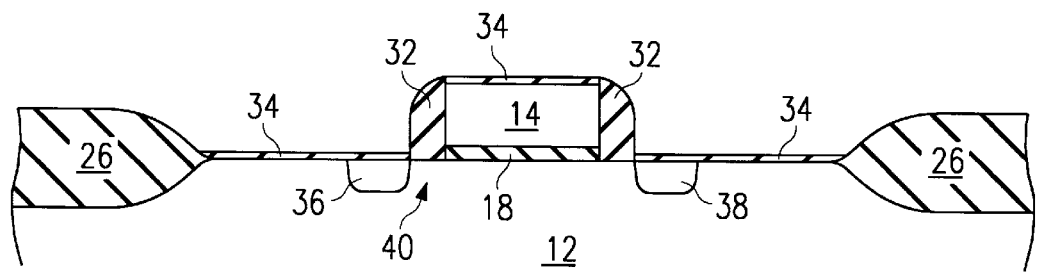

Referring to FIG. 1C, the insulator layer 30 may be anisotropically etched to form a pair of side walls 32. The anisotropic etch is conventionally a reactive ion etch (RIE) using carbon fluorine-based gases such as $CF_4$ and/or $CHF_3$. The side walls 32 electrically isolate ends of the gate body 14 from other elements of the transistor.

The anisotropic etch may leave a residual layer of contaminants 34 on the outer surface 16 of the semiconductor layer 12 and on the outer surface 22 of the gate body 14. To remove the residual layer of contaminants 34, the semiconductor structure may be cleaned by emersion in an acid bath or the like. Such cleaning, however, removes only some of the contaminants. As a result, the residual layer of contaminants 34 remains on the outer surface 16 of the semiconductor layer 12 and on the outer surface 22 of the gate body 14 after cleaning.

The residual layer of contaminants 34 may become altered by temperature and/or exposure to various gases during thermal treatment. Thermal treatment may be used to activate and/or diffuse dopants implanted into the semiconductor layer 12. The alteration of the contaminants 34 interferes with silicide formation and leads to high sheet resistance of the source, drain and gate.

As described in related U.S. patent application Ser. No. 08/957,808, entitled "SURFACE PROTECTIVE LAYER FOR IMPROVED SILICIDE FORMATION," a protective layer may be deposited prior to thermal processing and removed after such processing. The protective layer covers the residual layer of contaminants 34 during thermal processing to prevent the contaminants 34 from being altered by high temperature exposure to various gases. As a result, the unaltered contaminants 34 do not later interfere with silicide formation to cause an increase in sheet resistance of the transistor.

In one embodiment, the protective layer may be deposited after implantation of dopants into the semiconductor layer 12. It will be understood, however, that the protective layer may be deposited prior to implantation of the dopants. The dopants may be implanted into a conductive source region 36 and a conductive drain region 38 of the semiconductor layer 12. The side wall 32 proximate to the conductive source region 36 may be a source side insulator body. The side wall 32 proximate to the conductive drain region may be a drain side insulator body. The conductive source region 36 and the conductive drain region 38 may be spaced opposite one another and apart from the gate body 14 to define a channel region 40 in the semiconductor layer 12. The channel region 40 may be disposed inwardly of the gate insulator 18.

Figure 1D:
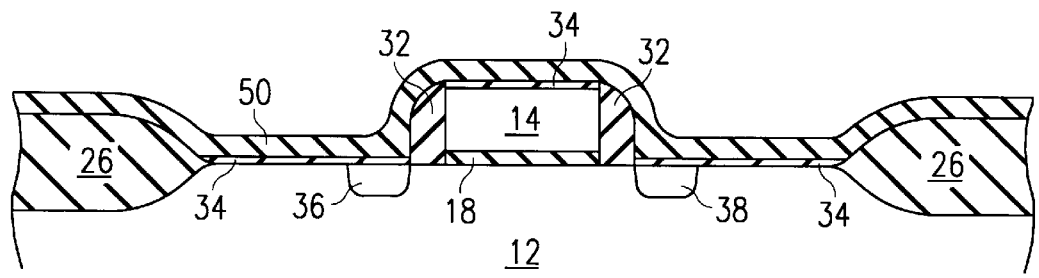

Referring to FIG. 1D, the protective layer 50 may be deposited outwardly of the residual layer of contaminants 34. In one embodiment, the protective layer 50 may be deposited directly onto the semiconductor layer 12, the side walls 32 and the gate body 14 to completely cover the residual layer of contaminants 34. The protective layer 50 may be a thin layer of tetraethylorthosilicate (TEOS) or oxide such as silicon dioxide. It will be understood that the protective layer 50 may include other and different types of materials capable of covering and protecting the contaminants 34 during thermal treatment. For an embodiment comprising silicon dioxide, the protective layer 50 may be on the order of 100–250 angstroms in thickness.

Figure 1E:
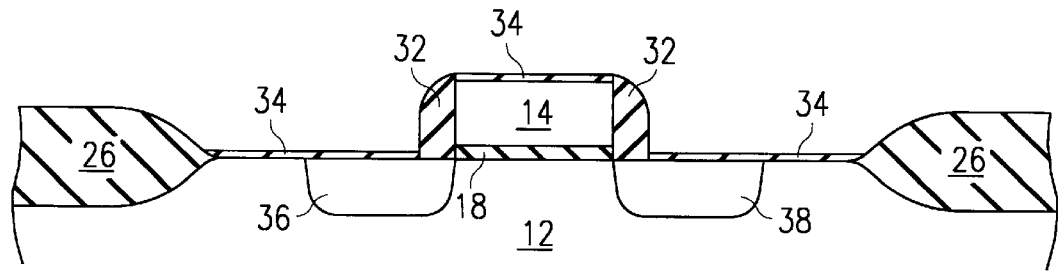

With the protective layer 50 covering the contaminants 34, the semiconductor structure may be thermally treated to activate the dopants implanted in the conductive source and drain regions 36 and 38. During thermal treatment, the dopants may diffuse at a known rate in the semiconductor layer 12. The dopants defuse by spreading through the semiconductor layer 12. As shown by FIG. 1E, the dopants may expand the conductive source region 36 and the conductive drain region 38 to define the channel 40 directly under the gate insulator 18.

In one embodiment, the thermal treatment may be rapid thermal processing (RTP). Rapid thermal processing exposes the semiconductor structure to a high temperature for a short period of time. In this embodiment, the semiconductor structure may be placed in a high temperature furnace and exposed to temperatures in excess of 900° Celsius for five or more seconds. In the furnace, the semiconductor structure may also be exposed to an ambient gas comprising nitrogen ($N_2$). It will be understood that the thermal treatment may involve disparate temperatures, time periods and/or ambient gases. For example, the thermal treatment may proceed at a lower temperature for a greater length of time. In this embodiment, the semiconductor structure may be exposed to a temperature of about 500° Celsius or greater for twenty (20) or more minutes.

Following thermal treatment, the protective layer 50 may be removed from the semiconductor structure by the combined dry and wet etch of the present invention. In this embodiment, the protective layer 50 is the outer layer to be removed from the inner surface. The inner surface is the semiconductor layer 12, the side walls 32 and the gate body 14 onto which the protective layer 50 is deposited. It will be understood that the inner surface may be another layer within the scope of the present invention.

Figure 1F:
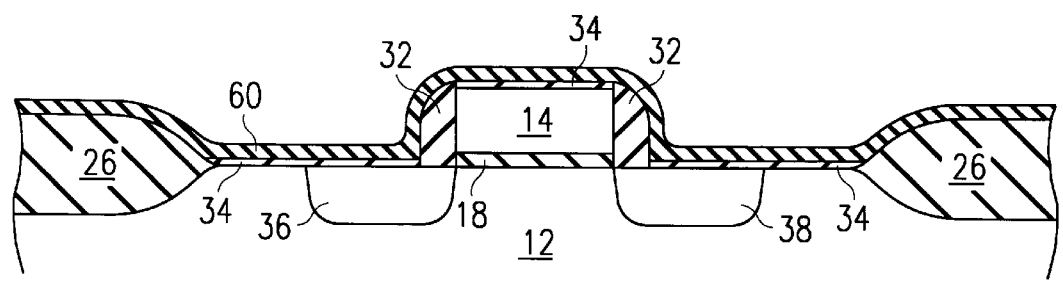

The combined dry and wet etch may comprise a dry anisotropic etch and a wet isotropic etch. Referring to FIG. 1E, the dry anisotropic etch may be used to remove a portion of the protective layer 50 from the inner surface. In one embodiment, the dry anisotropic etch may remove all but 5–100 Angstroms of the protective layer 50, with a target of 50 Angstroms. Accordingly, for a typical oxide layer of 200 Angstroms, the dry anisotropic etch may remove approximately 75% of the protective layer 50 from the inner surface. Referring to FIG. 1F, the wet isotropic etch may then be used to remove a remaining portion of the protective layer 50 from the inner surface.

The dry anisotropic etch is conventionally a reactive ion etch (RIE) using carbon fluorine-based gases such as $CF_4$ and/or $CHF_3$. Because the dry etch is anisotropic, it will not attack the side walls 32. As previously described, however, the dry anisotropic etch would leave contaminants on the outer surface 16 of the semiconductor layer 12 and on the outer surface 22 of the gate body 14 if allowed to etch away the entire protective layer 50. Accordingly, the wet isotropic etch is used to remove the remaining portion of the protective layer 50. The wet isotropic etch may be a HF etch or the like. As a result, the contaminants left by the partial dry anisotropic etch are removed with the remaining portion of the protective layer 55. Because the wet isotropic etch is limited in duration, it will not impair the side walls 32 and/or other elements of the transistor. As used herein, the term impair means to etch to a point where an element and/or layer is inoperative. Accordingly, the protective layer 50 is removed without adding another layer of residual contaminants. Such a layer of contaminant could interfere with later semiconductor processing such as silicide formation.

It will be understood that more or less of the protective layer 50 may be removed by the dry anisotropic etch or by the wet isotropic etch so long as contaminants left by the dry anisotropic etch are removed to at least a point where the contaminants do not interfere with later processing and where the wet isotropic etch will not impair the inner surface. It will be further understood that the combined dry and wet etch of the present invention may be used to remove other types of layers during other stages of semiconductor fabrication. For example, the combined dry and wet etch may be used to form the side walls 32 from the insulator layer 30. In this embodiment, no residual layer of contaminants will be left on the outer surface 16 of the semiconductor layer 12 or on the outer surface 22 of the gate body 14. Accordingly, in this embodiment, a protective layer may not be needed during thermal treatment.

Figure 1G:
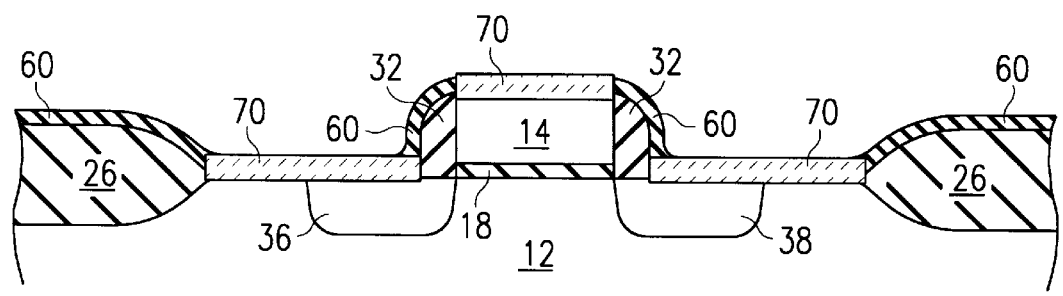

Referring to FIG. 1G, a metal layer 60 may be deposited outwardly of the semiconductor layer 12 and the gate body 14. In one embodiment, the metal layer 60 may be deposited directly onto the semiconductor layer 12, the gate body 14, the side walls 32 and the field oxide 26. The metal layer 60 may comprise nickel, cobalt or other materials capable of forming a silicide layer of low sheet resistance on a narrow linewidth transistor. Preferably, the silicide layer has a sheet resistance of less than 50 ohms per square.

Nickel and cobalt cannot reduce native oxide on silicon and are therefore especially sensitive to alteration of the contaminants 34. Altered contaminants 34 interfere with nickel and cobalt silicide formation to increase sheet resistance of the resulting silicide layer. As previously described, the protective layer 50 prevents alteration of the contaminants 34. Accordingly, nickel and cobalt may be used to form a silicide layer of a narrow linewidth transistor without undue interference from contaminants.

Figure 1H:
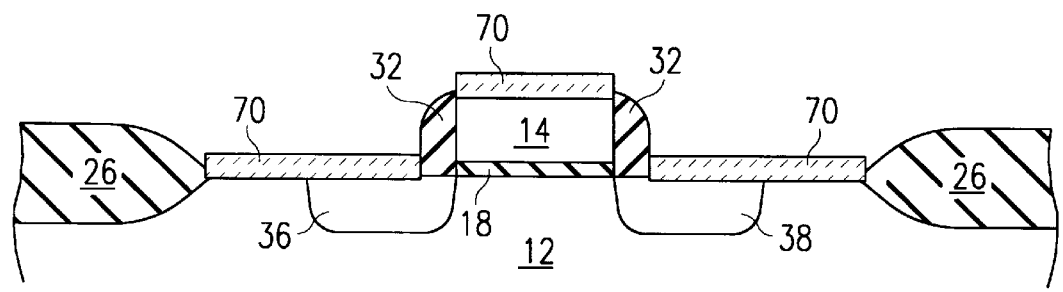

Referring to FIG. 1H, the metal layer 60 may be reacted with adjacent silicon material for silicidation of the metal layer 60 with the silicon. As shown by FIG. 1H, a silicide layer 70 may be interfused to the outer surface 16 of the semiconductor layer 12 and to the outer surface 22 of the gate body 14. The silicide layer 70 dramatically reduces the contact resistance and sheet resistance of the regions. Portions of the metal layer 60 adjacent to non-silicon bodies, such as the side walls 32 and the field oxide 26, will not react to form a silicide layer.

Referring to FIG. 1I, the semiconductor structure may be subjected to an aqua regia etch to remove portions of the metal layer 60 adjacent to non-silicon bodies which did not react to form the silicide layer 70. Conventional techniques can then be used to contact the gate body 14, the conductive source region 36 and the conductive drain region 38 via sections of the silicide layer 70.

In summary, the present invention provides a combined dry and wet etch that removes an outer layer without leaving a residual layer of contaminants on an inner surface that would interfere with later semiconductor processing and without impairing the inner surface and other elements of a transistor. The combined dry and wet etch may comprise a dry anisotropic etch and a wet isotropic etch. The dry anisotropic etch may be used to remove all but 5–100 Angstroms, or approximately 75%, of an outer layer from an inner surface. The wet isotropic etch may then be used to remove a remaining portion of the outer layer from the inner surface.

Although the present invention has been described with several embodiments, various changes and modifications may be suggested to one skilled in the art. It is intended that the present invention encompass such changes and modifications as fall within the scope of the appended claims.

What is claimed is:

1. A method of removing a unitary outer layer from an inner surface abutting said outer layer during semiconductor fabrication, comprising the steps of:
    anisotropically etching a portion of the outer layer; and
    then isotropically etching a remaining portion of the unitary outer layer, the isotropic etch not impairing the inner surface.

2. The method of claim 1, wherein said step of isotropically etching extends to said inner surface, the semiconductor processing further comprising the steps of:
    then depositing a metal layer outwardly of the inner surface; and
    forming a silicide layer by interacting the metal layer with at least a section of the inner surface.

3. The method of claim 1, wherein the anisotropic etch is a dry etch.

4. The method of claim 1, wherein the anisotropic etch is a reactive ion etch.

5. The method of claim 1, wherein the isotropic etch is a wet etch.

6. The method of claim 1, wherein the isotropic etch is an HF etch.

7. The method of claim 1, wherein the outer layer is an oxide layer.

8. The method of claim 1, wherein the outer layer is a silicon dioxide layer.

9. The method of claim 1 wherein said step of anisotropically etching is a dry etch, said step of anisotropically etching retaining from about 5 to about 100 Angstroms of said unitary outer layer.

10. The method of claim 1 wherein said step of anisotropically etching is a dry etch, said step of anisotropically etching retaining about 50 Angstroms of said unitary outer layer.

11. The method of claim 1 wherein said step of anisotropically etching is a dry etch, said step of anisotropically etching retaining about 75 percent of said unitary outer layer.

12. The method of claim 1 wherein said step of wet etching extends to said inner surface.

13. The method of claim 9 wherein said step of wet etching extends to said inner surface.

14. The method of claim 10 wherein said step of wet etching extends to said inner surface.

15. The method of claim 11 wherein said step of wet etching extends to said inner surface.

16. A method of fabricating a transistor in a surface of a semiconductor layer, comprising the steps of:
    forming a gate body separated from an outer surface of the semiconductor layer by a gate insulator, the gate body having an inner surface proximate to the semiconductor layer and an opposite outer surface;
    depositing an insulator layer outwardly of the semiconductor layer and the gate body;
    anisotropically etching the insulator layer to form side walls adjacent to the gate body, the anisotropic etch causing a residual layer of contaminants to form on the outer surface of the semiconductor layer and on the outer surface of the gate body;
    implanting a dopant into the semiconductor layer proximate to the side walls;
    depositing a protective layer outwardly of the residual layer of contaminants;

thermally treating the semiconductor layer to activate the dopant;

anisotropically etching a portion of the protective layer;

wet etching a remaining portion of the protective layer, the wet etch not impairing the side walls;

depositing a metal layer outwardly of the semiconductor layer and the gate body; and forming a silicide layer by interacting the metal layer with the outer surface of the semiconductor layer and with the outer surface of the gate body.

17. The method of claim 16, wherein the anisotropic etch is a dry etch.

18. The method of claim 16, wherein the anisotropic etch is a reactive ion etch.

19. The method of claim 16, wherein the wet etch is an isotropic etch.

20. The method of claim 16, wherein the wet etch is a HF etch.

21. The method of claim 16, wherein the protective layer is an oxide layer.

22. The method of claim 16, wherein the protective layer is a silicon dioxide layer.

23. The method of claim 16, wherein the metal layer comprises cobalt.

24. The method of claim 16, wherein the metal layer comprises nickel.

25. The method of claim 16, wherein the metal layer comprises titanium.

26. The method of claim 16, wherein the silicide layer has a sheet resistance of less than twenty (20) ohms per square.

* * * * *